United States Patent
Casper et al.

(10) Patent No.: US 6,995,627 B2
(45) Date of Patent: Feb. 7, 2006

(54) TRANSMITTER EQUALIZATION METHOD AND APPARATUS

(75) Inventors: Bryan K. Casper, Hillsboro, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 10/326,917

(22) Filed: Dec. 20, 2002

(65) Prior Publication Data

US 2004/0119461 A1    Jun. 24, 2004

(51) Int. Cl.
*H04B 3/04* (2006.01)
(52) U.S. Cl. .................. 333/18; 333/20; 333/28 R
(58) Field of Classification Search .............. 333/18, 333/20, 28 R; 330/330, 86; 375/229, 224, 375/286, 316, 319
See application file for complete search history.

(56) References Cited

U.S. PATENT DOCUMENTS

| | | | |
|---|---|---|---|
| 6,492,876 B1 * | 12/2002 | Kamal et al. | 330/304 |
| 6,507,225 B2 * | 1/2003 | Martin et al. | 327/108 |
| 6,512,789 B1 * | 1/2003 | Mirfakhraei | 375/229 |
| 6,614,296 B2 * | 9/2003 | Casper | 330/9 |
| 6,724,329 B2 * | 4/2004 | Casper | 341/106 |

OTHER PUBLICATIONS

Farjad-Rad, R., "A 0.4-μm CMOS 10-Gb/s 4-PAM Pre-Emphasis Serial Link Transmitter", *IEEE Journal of Solid-State Circuits*, 34 (5), (May 1999), pp. 580-585.

* cited by examiner

*Primary Examiner*—Benny Lee
*Assistant Examiner*—Kimberly Glenn
(74) *Attorney, Agent, or Firm*—Schwegman, Lundberg, Woessner & Kluth, P.A.

(57) ABSTRACT

A current mode output driver includes a pre-driver for pre-equalization. The current mode output driver drives a transmission line with an alternating current (AC) signal and a direct current (DC) signal. Characteristics of the transmission line are measured by comparing a received amplitude of the AC signal and a received amplitude of the DC signal. A ratio of the AC received amplitude to the DC received amplitude is compared to ratios derived from possible equalization settings to determine an equalization setting appropriate to equalize the channel.

30 Claims, 9 Drawing Sheets

TRANSMITTER EQUALIZATION METHOD AND APPARATUS

FIELD

The present invention relates generally to integrated circuit interfaces, and more specifically to integrated circuit interfaces having current mode drivers.

BACKGROUND

Integrated circuits typically have dedicated interface circuits to communicate with other integrated circuits and other systems. Signals that travel from one integrated circuit to another are becoming faster and faster. As signal speeds increase, the effect of imperfect "channels" also increases. A "channel," for the purposes of this description, is any medium that the signal passes through. For example, a channel may consist of printed circuit board traces or wires routed between integrated circuits. One possible effect of an imperfect channel is frequency dependent attenuation of signal amplitudes. In general, when the signal amplitude is attenuated as a function of frequency, the signal becomes smaller as the speed increases. When the signal gets too small, communications between integrated circuits can become unreliable.

One known method for compensating for frequency dependent attenuation is the use of pre-equalization at the driver. Pre-equalization adjusts the amplitude of the driver depending on the frequency of outbound data. Successful pre-equalization compensates for signal loss in the channel, and results in a substantially constant amplitude received voltage wave for low and high frequency data. One mechanism for pre-equalization is described in: Ramin Farjad-Rad, Chih-Kong Ken Yang, Mark A. Horowitz, and Thomas H. Lee, "A 0.4-um CMOS 10-Gb/s 4-PAM Pre-Emphasis Serial Link Transmitter," Vol. 34, No. 5, IEEE Journal of Solid-State Circuits, (May 1999).

For the reasons stated above, and for other reasons stated below which will become apparent to those skilled in the art upon reading and understanding the present specification, there is a need in the art for alternate integrated circuit interfaces.

DESCRIPTION OF EMBODIMENTS

Figure 1:
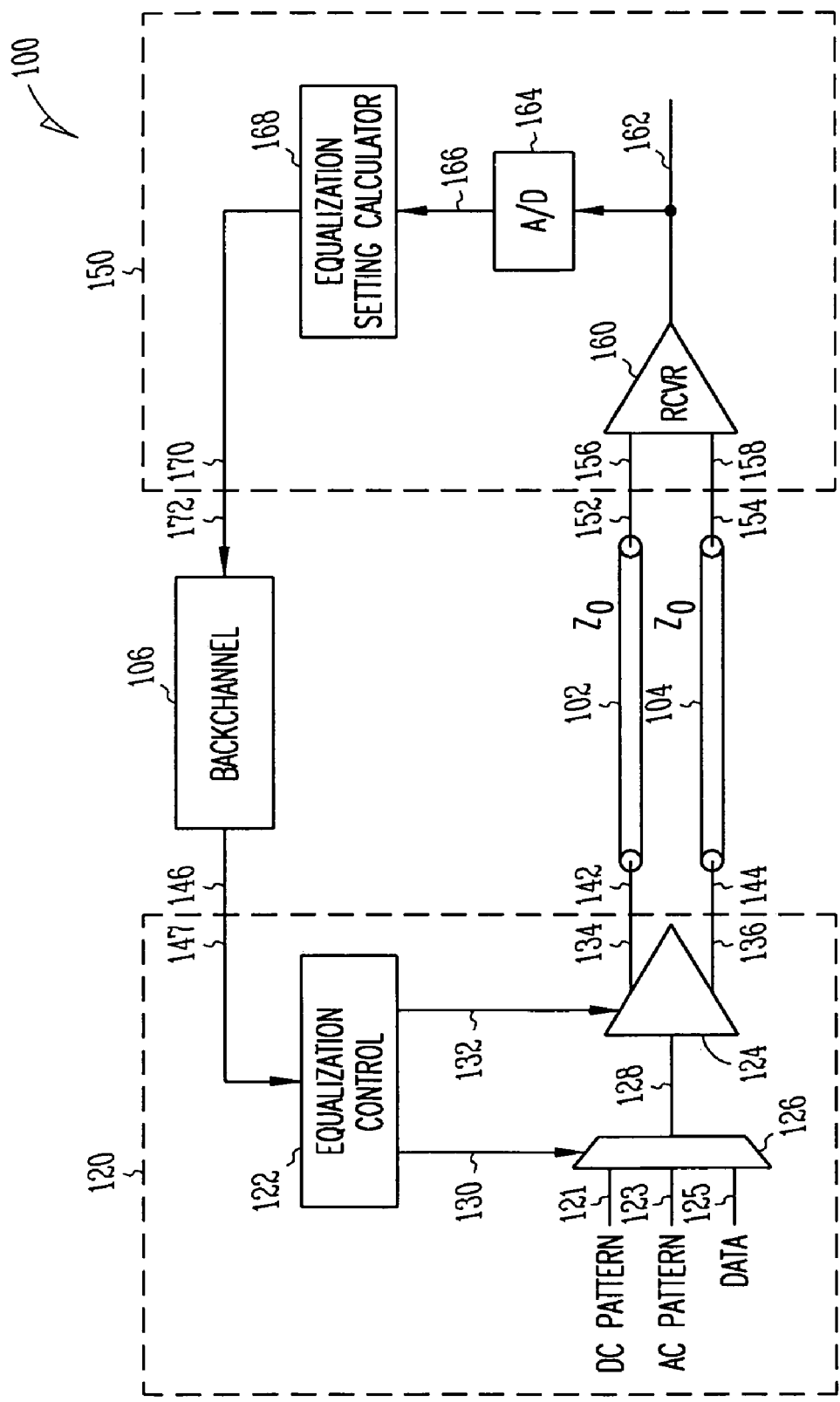
FIG. 1 shows an electronic system having two interconnected integrated circuits.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows an electronic system having two interconnected integrated circuits. System 100 includes integrated circuits 120 and 150 interconnected by conductors 102 and 104 and backchannel 106. In the embodiments represented by FIG. 1, conductors 102 and 104 are transmission lines having a characteristic impedance of $Z_0$. Integrated circuit 120 drives signals on conductors 102 and 104, and integrated circuit 150 receives signals on conductors 102 and 104. For simplicity, a single pair of conductors is shown interconnecting integrated circuits 120 and 150. In some embodiments, a bus is formed from multiple pairs of conductors between integrated circuits 120 and 150.

Conductors 102 and 104 form a high-speed unidirectional data path between integrated circuits 120 and 150. In other embodiments, conductors 102 and 104 form a high-speed bi-directional data path. Various bi-directional embodiments are shown in figures following FIG. 1. The components within integrated circuits 120 and 150, and the operation thereof, are explained below.

Integrated circuit 120 includes equalization control block 122, multiplexer 126, and current mode output driver 124. Multiplexer 126 receives outbound data on node 125, an alternating current (AC) pattern of data on node 123, and a direct current (DC) pattern of data on node 121. Multiplexer 126 selects one of these three sources of data based on a control value received on node 130 from equalization control block 122. As described in more detail below, data from nodes 121 and 123 is chosen to be transmitted on conductors 102 and 104 when characterizing the channel represented by conductors 102 and 104, and data from node 125 is chosen during normal data transmission. Multiplexer 126 drives data on node 128, which is input to current mode output driver 124. Current mode output driver 124 drives differential data lines 134 and 136, which in turn drive ports 142 and 144 of integrated circuit 120. Ports 142 and 144 are electrically coupled to conductors 102 and 104.

Figure 3:
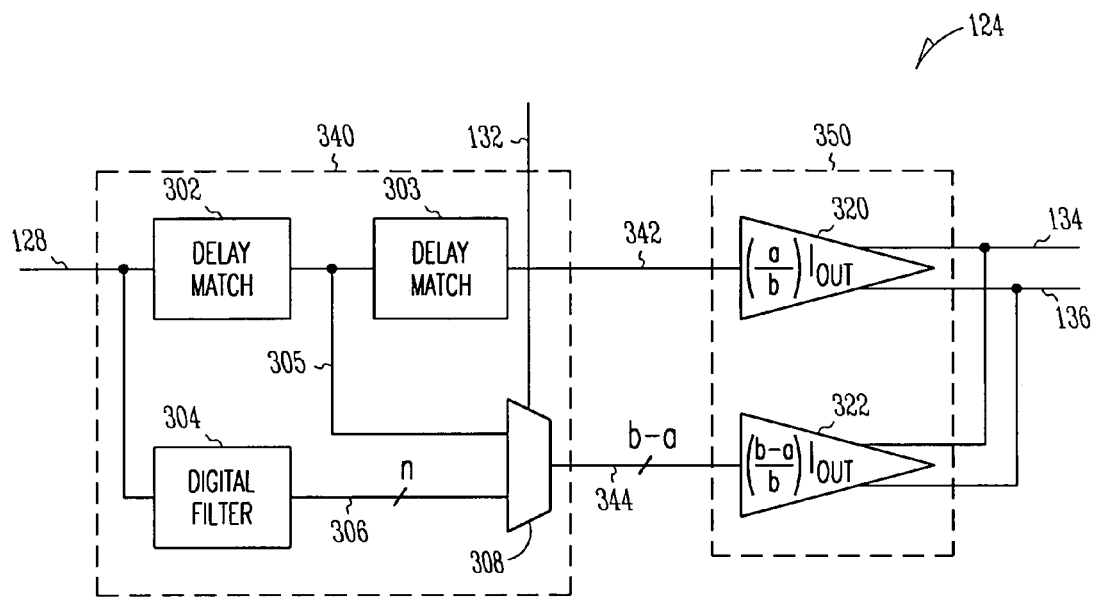
FIG. 3 shows components of a driver circuit.

In response to an equalization setting provided on node 132, current mode output driver 124 adjusts the amplitude of the output current drive on to compensate for channel variations in conductors 102 and 104. For example, if high frequency signals are attenuated in conductors 102 and 104, current mode output driver 124 can utilize the equalization setting to drive a higher amplitude when outbound data changes at a higher frequency. The operation of current mode output driver 124 with respect to equalization is described below with reference to pre-driver 340 and output driver 350 (FIG. 3).

Equalization control block 122 receives equalization information on node 147, which is coupled to port 146 of integrated circuit 120. In embodiments represented by FIG. 1, the equalization information includes information received through backchannel 106. Backchannel 106 may be any communications channel capable of transmitting equalization information from integrated circuit 150 to integrated circuit 120. For example, backchannel 106 may be traces on a circuit board, a wiring harness, a register, or a wireless link. Backchannel 106 may also be an interface provided by a processor. For example, a processor may read equalization information from port 172 on integrated circuit 150, and write it to port 146 on integrated circuit 120.

Equalization control block 122 may include any type of control circuitry capable of performing actions described herein. For example, equalization control block 122 may include a processor or a state machine. Equalization control block 122 may also include a memory mapped interface such that a processor external to integrated circuit 120 can cause equalization control block 122 to perform the actions described herein.

In some embodiments, equalization control block 122 performs actions in two different modes: a "calibration mode" and a "normal mode." During calibration mode, equalization control block 122 sets the equalization provided by driver 124 to a nominal value and causes multiplexer 126 to select the AC pattern for a time, and to select the DC pattern for a time. The AC and DC patterns are received by integrated circuit 150, and equalization information is transmitted to integrated circuit 120 on backchannel 106. Equalization control block 122 then enters normal mode by setting the equalization of driver 124, and causing multiplexer to select data provided on node 125.

Integrated circuit 150 includes receiver 160, analog-to-digital converter (A/D) 164, and equalization setting calculator 168. Integrated circuit 150 may also include many other types and variations of circuits, which are omitted in FIG. 1 for the sake of clarity. Receiver 160 receives signals on conductors 156 and 158. Conductors 156 and 158 are coupled to ports 152 and 154, respectively, which are in turn coupled to conductors 102 and 104, respectively. Receiver 160 generates a signal on node 162 that has an amplitude proportional to the amplitude of the signal received on nodes 156 and 158. The signal on node 162 is input to A/D 164. A/D 164 samples and digitizes the signal on node 162, and provides a digital word to equalization setting calculator 168 on node 166. FIG. 1 shows node 166 as a single line for clarity. In many embodiments, node 166 includes many physical signal lines. For example, node 166 may include four physical signal lines, and A/D 164 may provide four bit digital words to equalization setting calculator 168. Node 166 may also include more or less than four physical signal lines. In other embodiments, node 166 may include a single line, and A/D 164 may provide digital data serially to equalization setting calculator 168.

Equalization setting calculator 168 calculates an equalization setting. In embodiments represented by FIG. 1, the equalization setting is calculated from information received on node 166 during calibration mode, and the equalization setting is sent to integrated circuit 120 on backchannel 106. Equalization setting calculator 168 can calculate the equalization setting using any information that can be derived from information on node 166. In some embodiments, equalization setting calculator 168 receives information describing the received amplitude of a DC pattern and the received amplitude of an AC pattern. The received amplitudes of the DC and AC patterns can be used separately or together to aid in the determination of an equalization setting. In some embodiments, a ratio of the received AC pattern amplitude and the received DC pattern amplitude is utilized in the determination of an equalization setting.

The AC pattern can be any pattern of data that varies. In some embodiments, the AC pattern includes digital data that alternates between a logical "1" and a logical "0" each clock cycle, which renders a repeating pattern of "101010." In other embodiments, the AC pattern includes digital data that alternates between a logical "1" and a logical "0", but not on every clock cycle. For example, in some embodiments, the AC pattern may include a pattern of "1100110011," and in other embodiments, the AC pattern may include a pattern of "111000111000." Any non-constant pattern of digital data can be used as the AC pattern without departing from the scope of the present invention. The DC pattern can be a series of logical "1"s or a series of logical "0"s.

In some embodiments, system 100 enters calibration mode when the system is powered on. Equalization control block 122 commands multiplexer 126 to send a DC pattern to driver 124 for a time, and then commands multiplexer 126 to send an AC pattern for a time. The order in which the DC pattern and AC pattern are selected is not important. For example, equalization control block 122 may command multiplexer 126 to send an AC pattern for a time prior to commanding multiplexer 126 to send a DC pattern for a time. During calibration mode, equalization setting calculator 168 obtains information describing the received amplitude of the AC and DC patterns, and determines an equalization setting. The equalization setting is sent to integrated circuit 120 using backchannel 106, and equalization control block 122 applies the equalization setting to driver 124. System 100 then enters normal mode, and driver 124 transmits data from node 125 using the applied equalization setting.

In some embodiments, system 100 periodically enters calibration mode and performs the actions listed in the previous paragraph. In these embodiments, system 100 periodically updates the equalization setting applied to driver 124. In other embodiments, system 100 enters calibration mode in response to external stimuli, such as a reset signal, or a calibration signal (not shown). Any mechanism may be used to cause system 100 to enter calibration mode and to cause system 100 to determine equalization settings.

In some embodiments that include multiple pairs of conductors 102 and 104, equalization settings can be generated by measuring the received AC and DC amplitudes for each pair of conductors, determining equalization settings for each driver, and applying each of the separate equalization settings to each driver. In other embodiments that include multiple pairs of conductors 102 and 104, equalization settings can be generated by measuring the received AC and DC amplitudes for one pair of conductors, determining a single equalization setting, and applying the single equalization setting to more than one driver.

Integrated circuits 120 and 150 can be any type of integrated circuits capable of including simultaneous drivers and receivers as shown. For example, either integrated circuit can be a processor such as a microprocessor, a digital signal processor, a microcontroller, or the like. Integrated circuits 120 and 150 can also be integrated circuits other than a processor such as an application-specific integrated circuit (ASIC), a communications device, a memory controller, or a memory such as a dynamic random access memory (DRAM).

Figure 2:
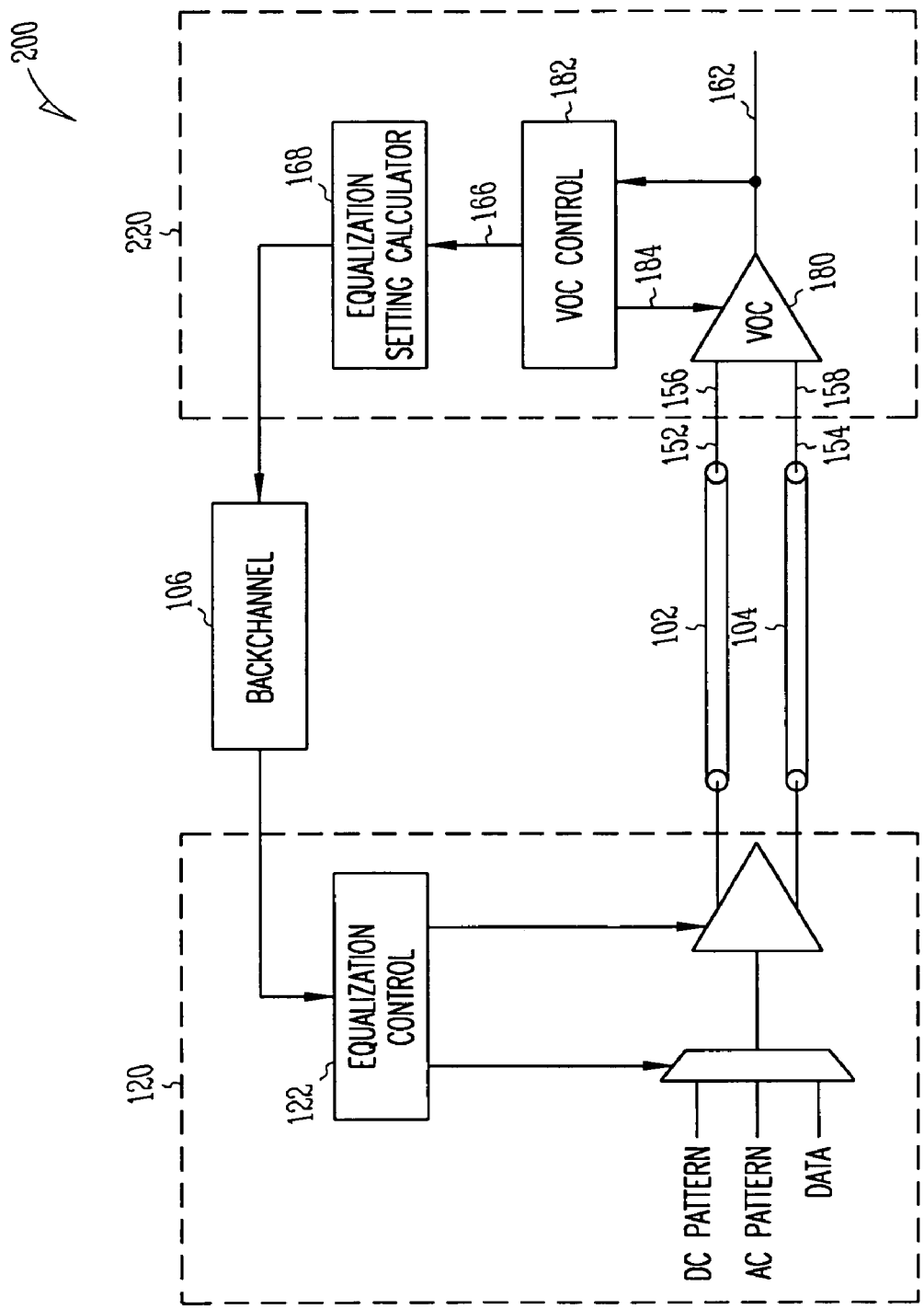
FIG. 2 shows an alternate electronic system having two interconnected integrated circuits.

FIG. 2 shows an alternate electronic system having two interconnected integrated circuits. System 200 includes integrated circuits 120 and 220, conductors 102 and 104, and backchannel 106. Integrated circuit 120, conductors 102 and 104, and backchannel 106 are described above with reference to FIG. 1. Integrated circuit 220 includes variable offset comparator (VOC) 180, variable offset comparator control (VOC) control block 182, and equalization setting calculator 168. Equalization setting calculator 168 is described above with reference to FIG. 1.

Variable offset comparator 180 receives signals on nodes 156 and 158, and compares the differential amplitude to an offset. The offset is programmable, or "variable." In embodiments represented by FIG. 2, the offset of VOC 180 is controlled by VOC control block 182. VOC control block 182 sets the variable offset of VOC 180 by varying the value of signals on node 184. In some embodiments, node 184 is a single physical conductor that carries an analog signal to control the offset of VOC 180. In other embodiments, node 184 includes multiple physical conductors that carry a digital signal to control the offset of VOC 180.

When in calibration mode, VOC control block 182 varies the offset of VOC 180 until a digital signal on node 162 changes state. VOC control block 182 receives the signal on node 182, and provides equalization setting calculator 168 with an indication of the offset or the received signal amplitude on node 166.

Embodiments represented by FIG. 2 include a variable offset comparator and a control mechanism to determine the received amplitude of signals transmitted from one integrated circuit to another on conductors 102 and 104. This is in contrast to embodiments represented by FIG. 1 in which the received amplitude of signals is determined with an A/D. Any embodiment herein described as using an A/D may also use a VOC, and any embodiment herein described as using a VOC may also use an A/D.

Figure 4:
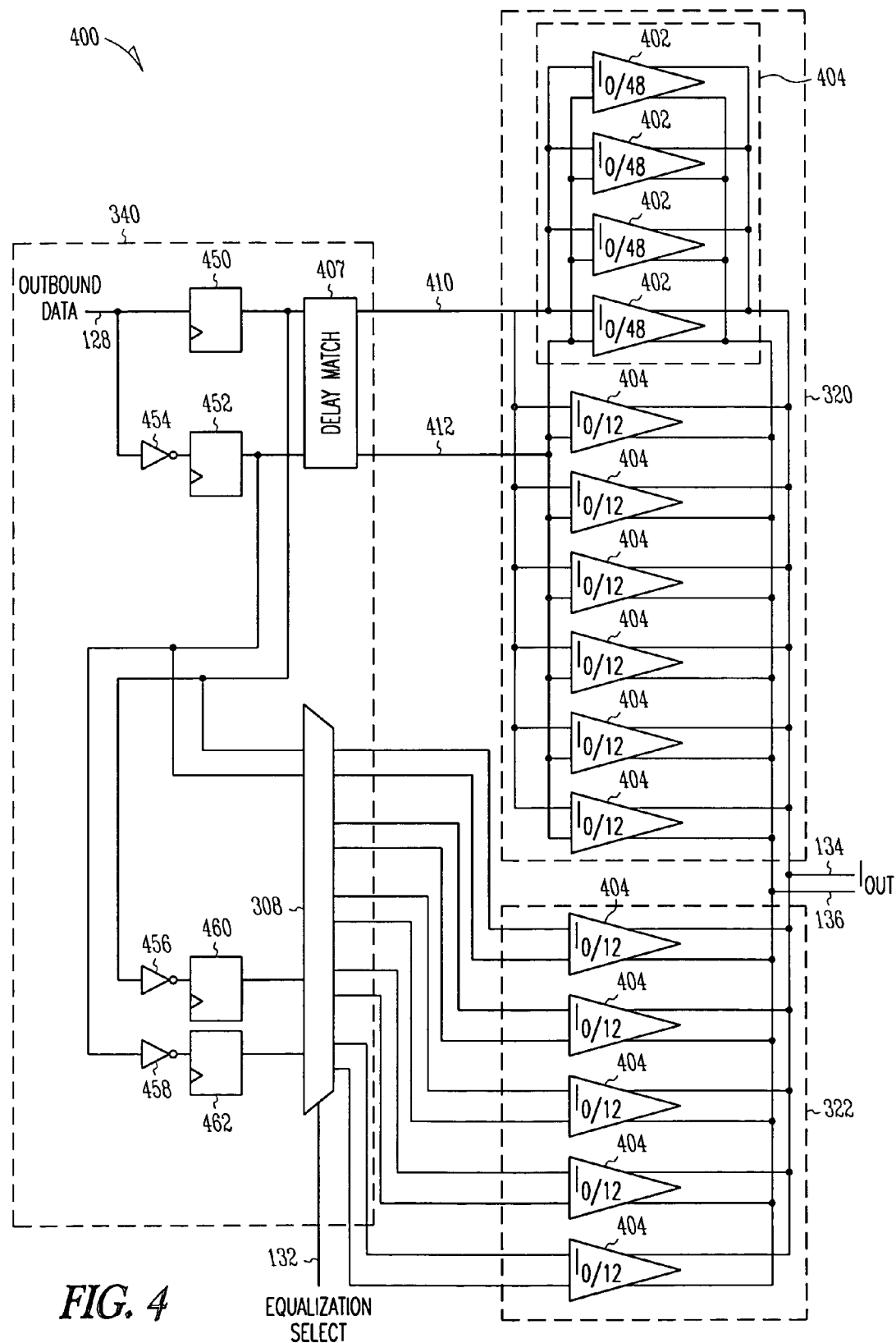
FIG. 4 shows a pre-driver circuit and a current mode output driver.

FIG. 3 shows components of a driver circuit. Driver circuit 124 includes pre-driver 340 and output driver 350. As shown in FIG. 3, pre-driver 340 includes delay match elements 302 and 303, digital filter 304, and multiplexer 308. Digital filter 304 and delay match element 302 receive outbound data on node 128. Digital filter 304 receives the outbound data and produces pre-equalization data on node 306. In different embodiments, digital filter 304 has a different number of filter taps, shown as "n" on node 306. In general, embodiments having more digital filter taps can equalize for a greater number of frequencies. A digital filter embodiment with two taps is shown in FIG. 4. Delay match element 302 receives outbound data and delays it to match the delay of digital filter 304. Delay match element 303 receives the delayed outbound data on node 305 and delays it to match the delay of multiplexer 308.

Multiplexer 308 receives outbound data on node 305 and also receives pre-equalization data on node 306. Multiplexer 308 selects either outbound data or pre-equalization data to drive node 344. In some embodiments, node 344 is many physical nodes, and multiplexer 308 selects a variable number of output nodes as a function of equalization select data on node 132. For example, as shown in FIG. 3, node 344 includes a number of physical nodes equal to "b-a." Variable amounts of equalization are achieved by varying the equalization select data on node 132. For example, in embodiments in which "b-a" equals ten, multiplexer 308 can select any number of the ten nodes to drive pre-equalization data and any number to drive outbound data.

Current mode output driver 350 includes two separate drivers 320 and 322 having output current summed on the outputs. The total sum of output current is $I_{out}$. Driver 320 sources a fraction of $_{out}$ equal to $(a/b)I_{out}$, and driver 322 sources a fraction equal to $((b-a)/b)I_{out}$. In some embodiments, these fractional currents are achieved by providing a total number of current drivers equal to "b" and dividing them into two groups; one having "a" drivers, and another having "b-a" drivers. One such embodiment is shown in FIG. 4. Driver 320 receives outbound data from pre-driver 340, and driver 322 receives a combination of outbound data and pre-equalization data on node 344. The output current of driver 320 provides $(a/b)I_{out}$ of output current as a result of the outbound data. The output current of driver 322 provides $((b-a)/b)I_{out}$ of current divided among outbound data and pre-equalization data. This allows a variable amount of equalization based on equalization select data on node 132.

FIG. 4 shows a pre-driver circuit and a current mode output driver. Pre-driver 340 includes inverters 454, 456, and 458, flip-flops 450, 452, 460, and 462, delay match element 407, and multiplexer 308. Flip-flops 450 and 452 correspond to delay match element 302 (FIG. 3), delay match element 407 corresponds to delay match element 303 (FIG. 3), and the combination of flip-flops 450, 452, 460, and 462, and inverters 456 and 458 correspond to digital filter 304 (FIG. 3). The digital filter of FIG. 4 is a two-tap digital filter, of which other embodiments exist within the scope of the present invention. Multiplexer 308 receives the delayed outbound data, and also receives the digital filter output. In the embodiments represented by FIG. 4, multiplexer 308 has differential inputs. In other embodiments, single-ended inputs are employed.

Drivers 320 and 322 combine to form current mode output driver 350, and drive differential data lines on nodes 134 and 136. Driver 350 is divided up into 12 driver elements 404. This corresponds to a value of 12 for the variable "b" in FIG. 3. Seven of the 12 driver elements 404 are included in driver 320, and five of the 12 driver elements 404 are included in driver 322. This corresponds to a value of seven for the variable "a" in FIG. 3. Each driver element 404 drives $1/12$ of the total output current $I_{out}$.

The seven driver elements 404 of driver 320 always drive outbound data on nodes 134 and 136. The five driver elements 404 of driver 322, on the other hand, can drive either outbound data or pre-equalization data depending on the state of the equalization select data on node 132. Because multiplexer 308 can drive a variable number of driver elements 404 with pre-equalization data, variable pre-equalization can be achieved. In the embodiment of FIG. 4, six levels of pre-equalization can be provided by driving between zero and five driver segments 404 with pre-equalization data. The six levels provide 0 dB, 1.5 dB, 3.5 dB, 6 dB, 9.5 dB, and 16 dB of pre-equalization. These six levels are summarized in Table 1, below. In general, current mode output driver 350 can be divided into any number of driver segments 404 to provide any range and resolution of pre-equalization.

TABLE 1

| Number of Segments driven by pre-equalization data (PRE_EQ) | Number of Segments driven by outbound data (NON_EQ) | Pre-equalization Provided |
|---|---|---|
| 0 | 12 | 0 dB |
| 1 | 11 | 1.5 dB |
| 2 | 10 | 3.5 dB |
| 3 | 9 | 6 dB |
| 4 | 8 | 9.5 dB |
| 5 | 7 | 16 dB |

Each driver segment 404 includes four driver subsegments 402, as shown near the top of FIG. 4. Each subsegment 402 has an output current drive capability equal to ¼ the drive of each driver segment 404. This equates to ⅟₄₈ $I_{out}$. Each subsegment 402 is substantially identical to all others, such that each has substantially identical AC properties. This allows accurate current scaling by varying the number driver subsegments 402 within each driver segment 404, while scaling other circuit parasitics by the same factor. Scaling current output along with circuit parasitics is useful when a return driver is utilized along with the output driver to drive a differential receiver. This can be useful in various embodiments, including embodiments that utilize bi-directional interfaces rather than unidirectional interfaces. Various embodiments employing bi-directional interfaces are described with reference to later figures.

Figure 5:
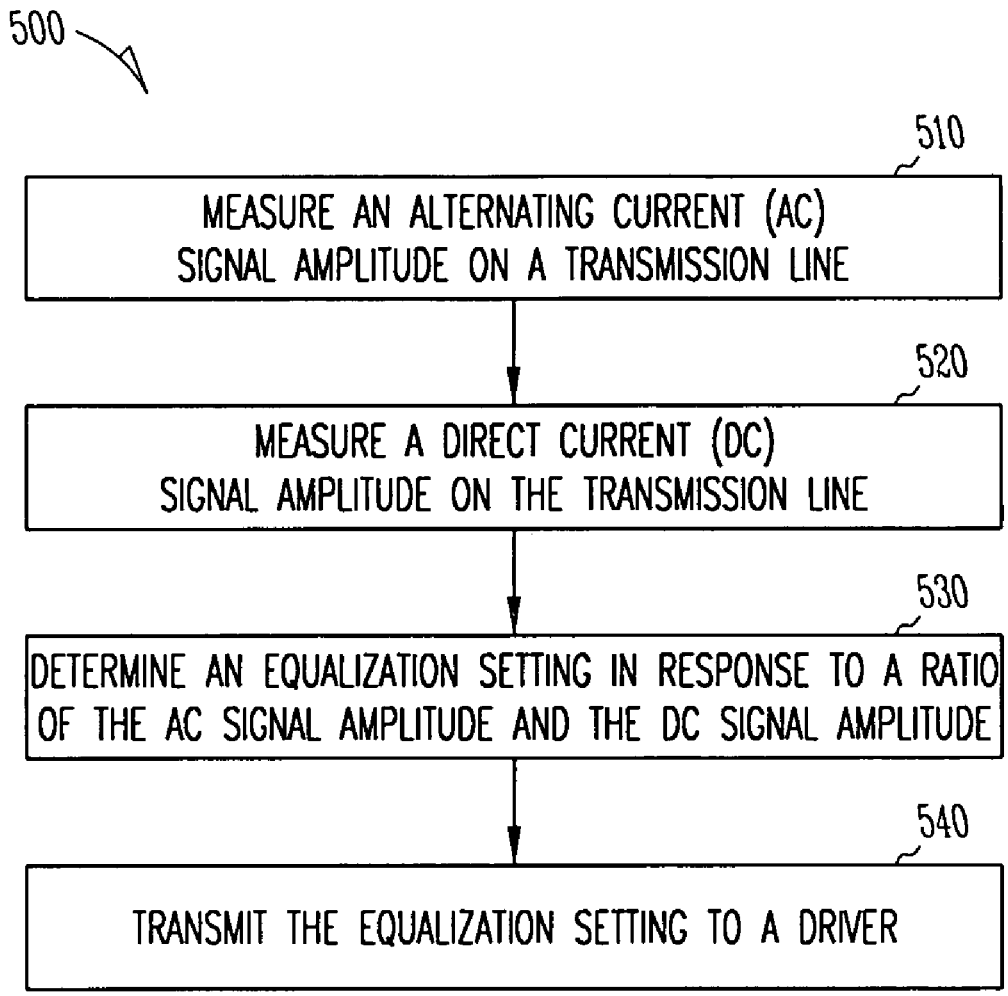
FIG. 5 shows a flowchart in accordance with various embodiments of the present invention.
Figure 9:
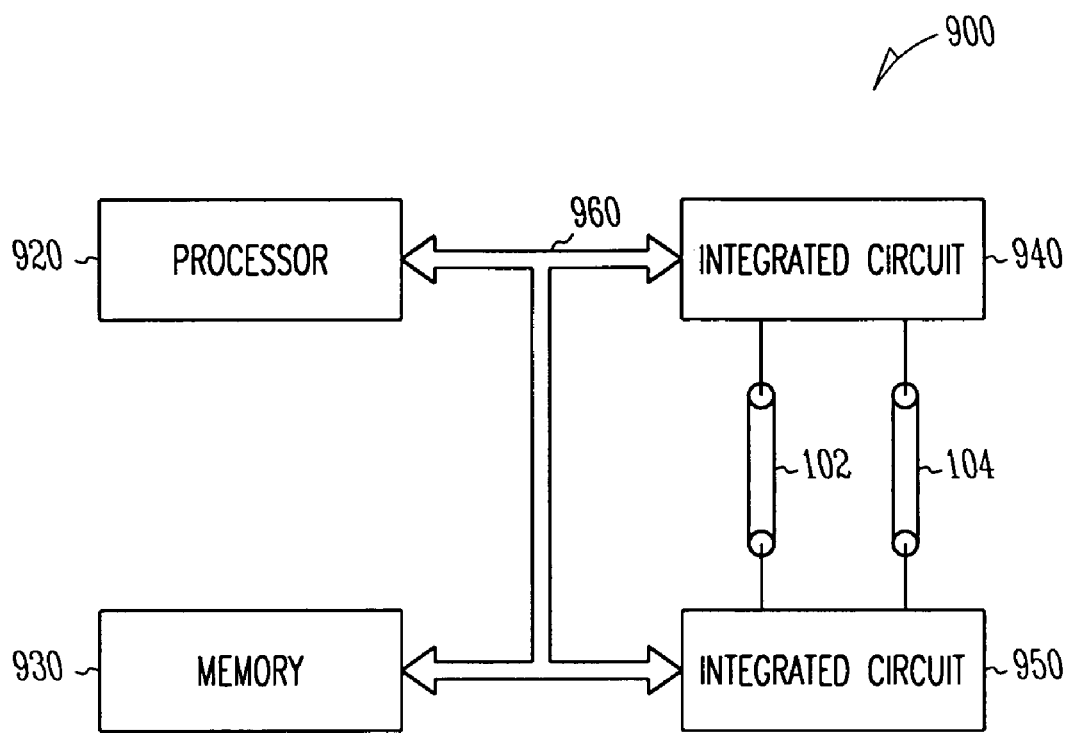
FIG. 9 shows an electronic system that includes a processor.

FIG. 5 shows a flowchart in accordance with various embodiments of the present invention. In some embodiments, method 500, or portions thereof, is performed by a processor such as processor 920 (FIG. 9, described below). In other embodiments, method 500 is distributed across multiple processors or controllers. For example, portions of method 500 may be performed by processor 920 (FIG. 9) while other portions of method 500 may be performed by VOC control block 182, equalization setting calculator 168, and equalization control block 122 (FIG. 2). The various actions in method 500 may be performed in the order presented, or may be performed in a different order. Further, in some embodiments, some actions listed in FIG. 5 are omitted from method 500.

Method 500 is shown beginning with block 510 in which an alternating current (AC) signal amplitude received on a transmission line is measured. In this context, the term "transmission line" may refer to a single conductor or to a pair of conductors. When "transmission line" is referring to a single conductor, block 510 is measuring the AC amplitude on a single-ended transmission line. When "transmission line" is referring to a pair of conductors, block 510 is measuring the AC amplitude on a differential transmission line. For example, in some embodiments, the transmission line of block 510 corresponds to conductors 102 and 104 of the previous figures, and the AC signal amplitude corresponds to a signal amplitude received at nodes 156 and 158 (FIGS. 1 and 2). In some embodiments, the AC signal amplitude is measured using an analog-to-digital converter, and in other embodiments, the AC signal amplitude is measured using a variable offset comparator.

Referring now back to FIG. 1, block 510 of method 500 may correspond to equalization control block 122 causing multiplexer 126 to select the AC pattern on node 123 and driver 124 transmitting the AC pattern on conductors 102 and 104. Block 510 may further correspond to receiver 160 receiving the signals and A/D 164 digitizing the amplitude received. Referring now to FIG. 2, block 510 may correspond to the combination of VOC 180 and VOC control block 182 determining the amplitude of the received AC signal.

In Block 520, a direct current (DC) signal amplitude on the transmission line is measured. The operations of block 520 are similar to the operations of block 510 with the exception that a DC signal is received rather than an AC signal. For example, referring now back to FIGS. 1 and 2, block 520 corresponds to equalization control block 122 causing multiplexer 126 to select the DC pattern on node 121.

In block 530, an equalization setting is determined in response to a ratio of the AC signal amplitude and the DC signal amplitude. In some embodiments, the following equation is utilized:

$$\frac{6 - \text{PRE\_EQ}}{6} \geq \frac{AC Amplitude}{DC Amplitude} > \frac{5 - \text{PRE\_EQ}}{6} \qquad \text{Eq. 1}$$

where NUM_EQ is the number of driver segments driven by pre-equalization data. As can be seen from equation 1, the ratio of AC and DC amplitudes is compared to ratios derived from possible equalization settings. Equation 1 may be used in embodiments with twelve drivers such as those embodiments represented by FIG. 3. For example, assuming a ratio of AC Amplitude to DC amplitude of 0.2, a PRE_EQ setting of 4 satisfies equation 1, resulting in 9 dB of equalization. A more general equation is:

$$\frac{x - 2y}{x} \geq \frac{AC Amplitude}{DC Amplitude} > \frac{x - 2 - 2y}{x} \qquad \text{Eq. 2}$$

where x is the total number of driver segments and y is the number of segments used for equalization (PRE_EQ). In some embodiments, the foregoing equations are implemented in a look-up table. Rather than perform mathematical calculations, an apparatus performing method 500 may look up the equalization setting as a function of the AC amplitude and the DC amplitude. The present invention is not limited by the form of the equations presented above. Any use of AC and DC amplitudes to determine an equalization setting is within the scope of the present invention.

In block 540, the equalization setting is transmitted to a driver. In some embodiments, block 540 corresponds to the equalization setting being transmitted over a backchannel such as those shown in earlier figures. In other embodiments, block 540 corresponds to setting the equalization of a driver in the same integrated circuit. Examples of these embodiments are shown and described with reference to later figures.

Figure 6:
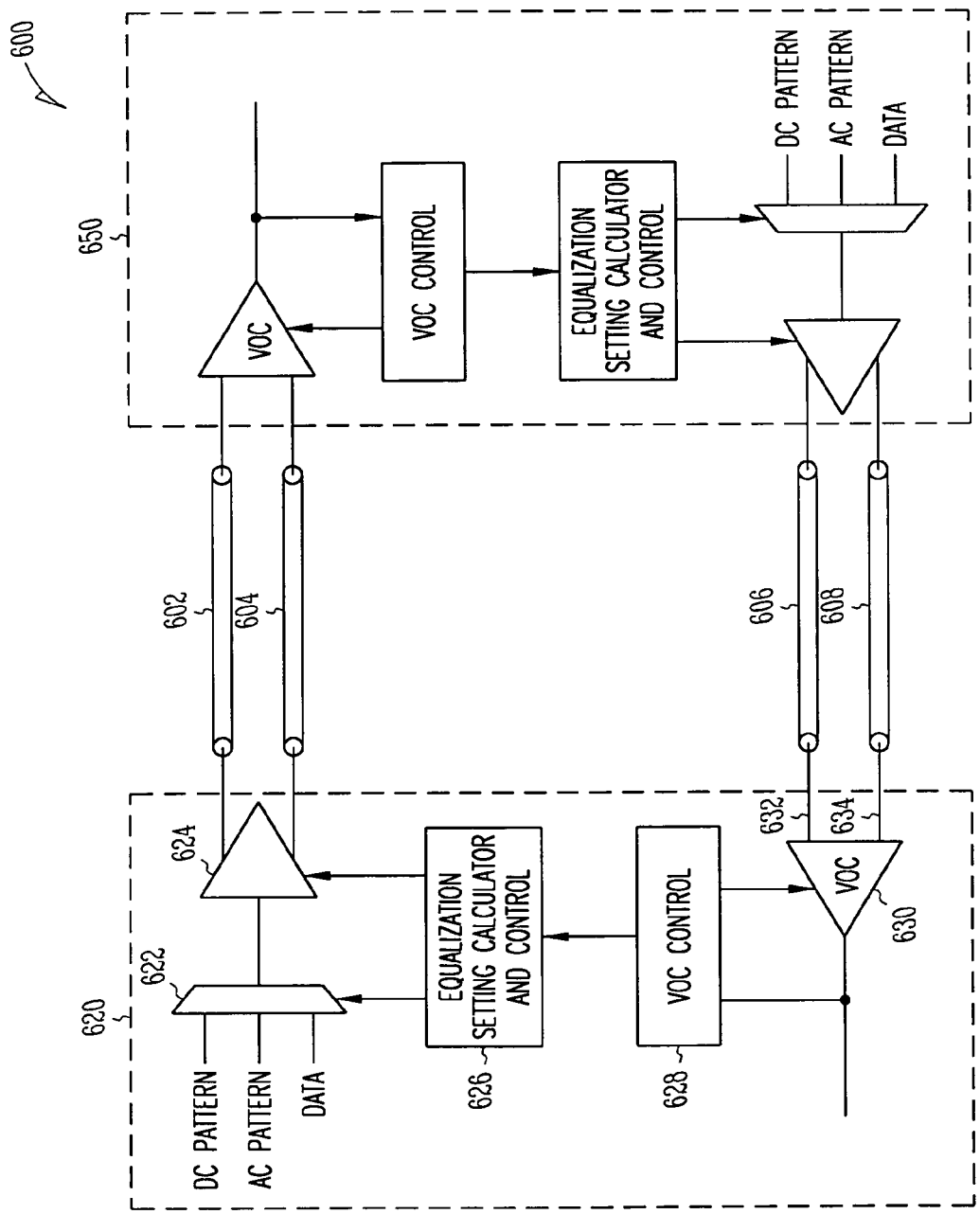
FIG. 6 shows another alternate electronic system having two interconnected integrated circuits.

FIG. 6 shows another alternate electronic system having two interconnected integrated circuits. System 600 includes integrated circuits 620 and 650. Integrated circuits 620 and 650 are interconnected by two pairs of conductors. A first pair of conductors 602 and 604 provide a unidirectional data path from integrated circuit 620 to integrated circuit 650. A second pair of conductors 606 and 608 provide a unidirectional data path from integrated circuit 650 to integrated circuit 620.

Integrated circuits 620 and 650 are shown having similarly circuitry. The circuitry within integrated circuit 620 is described further, and this description is also applicable to the circuitry shown within integrated circuit 650. Integrated circuits 620 and 650 can be any type of integrated circuit, and each may be the same type or a different type. For example, in embodiments having integrated circuits of different types, integrated circuit 620 may be a processor, and integrated circuit 650 may be a memory device.

Integrated circuit 620 includes multiplexer 622, driver 624, equalization setting calculator and control block 626, VOC control block 628, and VOC 630. VOC 630 receives a differential signal on nodes 632 and 634, and VOC control block 628 varies the offset of VOC 630 to determine the received signal amplitude as described with reference to previous figures. Equalization setting calculator and control block 626 receives the AC and DC signal amplitudes, determines an equalization setting, and applies the equalization setting to driver 624. Driver 624 may be any type of driver that includes equalization capability. For example, driver 624 may be of the type shown in FIG. 4.

In embodiments represented by FIG. 6, the AC and DC signal amplitudes are measured for one transmission line or pair of conductors, and those signal amplitudes are used to determine an equalization setting for a second transmission line or pair of conductors. Specifically, integrated circuit 620 measures the characteristics of conductors 606 and 608, and applies an equalization setting derived therefrom to driver 624 which drives conductors 602 and 604. These embodiments do not employ a backchannel such as backchannel 106 (FIG. 2). In some embodiments, conductors 602, 604, 606, and 608 are located in close proximity, and applying an equalization setting to one pair of conductors that is derived from a different pair of conductors results in satisfactory performance because all of the conductors share similar characteristics.

FIG. 6 shows a single pair of unidirectional interfaces. In some embodiments, multiple pairs of unidirectional interfaces exist. In some of these embodiments, the circuitry shown in integrated circuits 620 and 650 is duplicated multiple times such that applied equalization settings are derived from adjacent conductors. In other embodiments, characteristics of a single pair of conductors are measured, and the resulting equalization setting is applied to all drivers in the same integrated circuit.

Equalization setting calculator and control block 626 and VOC control block 628 may be implemented as dedicated control circuitry or as a processor interface. When implemented as a processor interface, a processor (not shown) performs the actions associated with equalization setting calculator and control block 626 and VOC control block 628 by reading and writing to integrated circuit 620. Various example embodiments employing processors are described below with reference to FIG. 9.

Figure 7:
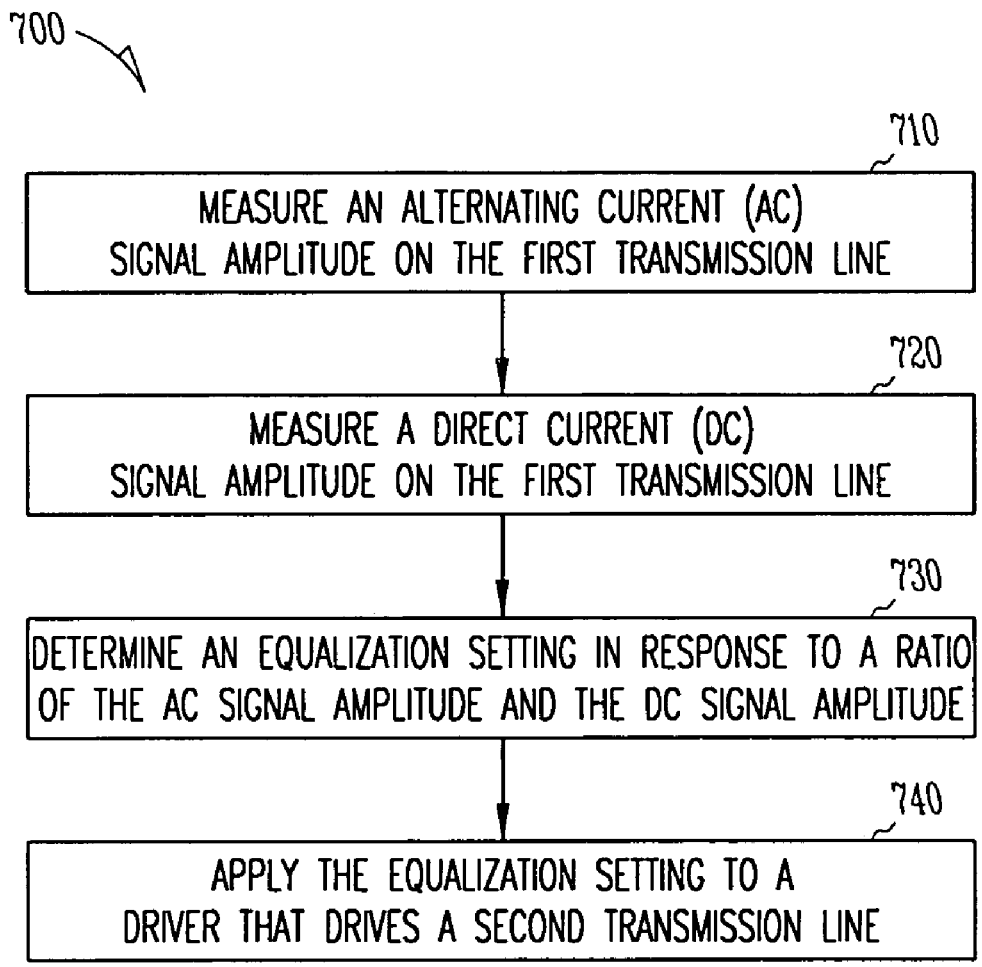
FIG. 7 shows a flowchart in accordance with various embodiments of the present invention.

FIG. 7 shows a flowchart in accordance with various embodiments of the present invention. In some embodiments, method 700, or portions thereof, is performed by a processor such as processor 920 (FIG. 9, described below). In other embodiments, method 700 is distributed across multiple processors or controllers. For example, portions of method 700 may be performed by processor 920 (FIG. 9) while other portions of method 700 may be performed by VOC control block 628 and equalization setting calculator and control block 626 (FIG. 6). The various actions in method 700 may be performed in the order presented, or may be performed in a different order. Further, in some embodiments, some actions listed in FIG. 7 are omitted from method 700.

Method 700 is shown beginning with block 710 in which an alternating current (AC) signal amplitude received on a first transmission line is measured. In this context, the term "transmission line" may refer to a single conductor or to a pair of conductors. When "transmission line" is referring to a single conductor, block 710 is measuring the AC amplitude on a single-ended transmission line. When "transmission line" is referring to a pair of conductors, block 710 is measuring the AC amplitude on a differential transmission line. For example, in some embodiments, the transmission line of block 710 corresponds to conductors 606 and 608 of the previous figures, and the AC signal amplitude corresponds to a signal amplitude received at nodes 632 and 634 (FIG. 6). In some embodiments, the AC signal amplitude is measured using an analog-to-digital converter, and in other embodiments, the AC signal amplitude is measured using a variable offset comparator.

Referring now back to FIG. 6, block 710 of method 700 may correspond to integrated circuit 650 transmitting an AC pattern on conductors 606 and 608. Block 710 may further correspond to the combination of VOC 630 and VOC control block 628 determining the amplitude of the received AC signal.

In block 720, a direct current (DC) signal amplitude on the first transmission line is measured. The operations of block 720 are similar to the operations of block 710 with the exception that a DC signal is received rather than an AC signal. For example, referring now back to FIG. 6, block 720 corresponds to integrated circuit 650 transmitting a DC pattern on conductors 606 and 608. Block 720 may further correspond to the combination of VOC 630 and VOC control block 628 determining the amplitude of the received AC signal.

In block 730, an equalization setting is determined in response to a ratio of the AC signal amplitude and the DC signal amplitude. This is described above with reference to block 530 (FIG. 5).

In block 740, the equalization setting is applied to a driver that drives a second transmission line. In some embodiments, block 740 corresponds to the equalization setting being applied to a driver that drives a transmission line with characteristics similar to the first transmission line. The second transmission line may be physically located close to the first transmission line. In other embodiments, the equalization setting may be applied to multiple drivers that drive a plurality of transmission lines.

Figure 8:
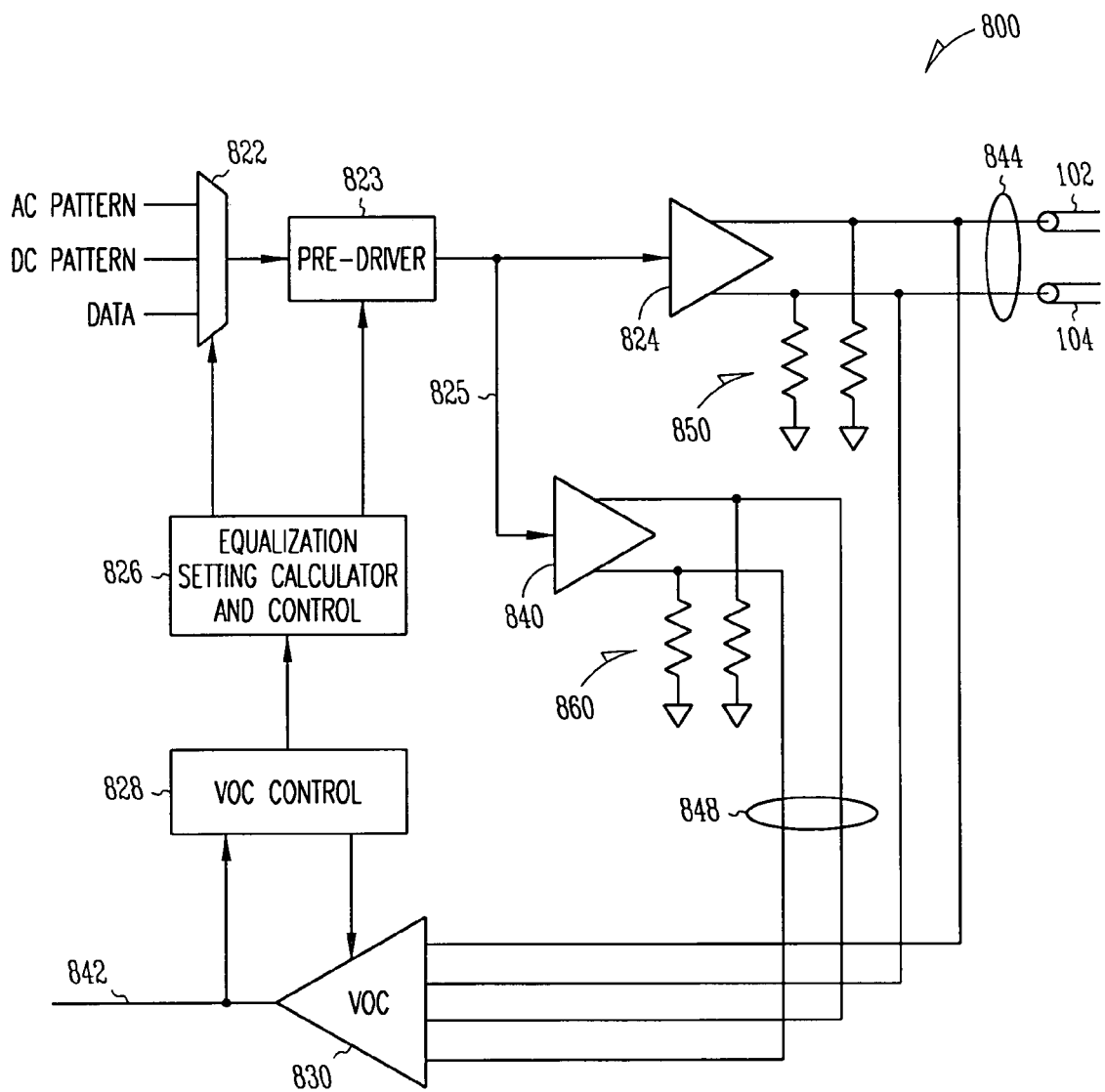
FIG. 8 shows components of a simultaneous bidirectional port circuit.

FIG. 8 shows components of a simultaneous bi-directional port circuit. Circuit 800 includes multiplexer 822, pre-driver 823, drivers 824 and 840, equalization setting calculator and control block 826, VOC 830, and VOC control block 828. Circuit 800 also includes termination resistors 850 and 860. Data on node 825 can drive current mode output driver 824 and current mode return driver 840 to one of multiple logical states. Drivers 824 and 840 are current drivers rather than voltage drivers. Current mode output driver 824 switches current between differential data lines 844 as a function of the logical state of data on node 825. Likewise, current mode return driver 840 switches current between differential data lines 848 as a function of the logical state of data on node 825.

Variable offset comparator (VOC) 830 is a differential receiver having two sets of differential input nodes, one coupled to differential data lines 844, and the other coupled to differential data lines 848. Differential data lines 844 include data driven by driver 824 as well as data driven by at least one other driver (not shown). In some embodiments, each of the drivers coupled to differential data lines 844 are in a different integrated circuits. In contrast, data lines 848 only include data driven by driver 840. Differential receiver 830 subtracts the differential voltage on differential data lines 848 from a differential voltage on differential data lines 844 to produce inbound data on node 842. Inbound data on node 842 represents data sent from a driver (not shown) coupled to differential data lines 844 other than driver 824.

In some embodiments, pre-driver 823 produces pre-equalization data from the outbound data and provides drivers 824 and 840 with both outbound data and pre-equalization data. In these embodiments, node 825 includes multiple physical nodes. For example, in some embodiments, pre-driver 823 drives a replica of the outbound data as well as pre-equalization data on multiple physical nodes to drivers 824 and 840. Pre-equalization data is utilized within driver 824 to adjust the amplitude of the output current drive on bidirectional data lines 844 to compensate for channel variations in conductors 102 and 104. For example, if high frequency signals are attenuated in conductors 102 and 104, current mode output driver 824 can utilize pre-equalization data to drive a higher amplitude when outbound data changes at a higher frequency. The operation of pre-driver 823 and driver 824 with respect to equalization is described above with reference to pre-driver 340 and output driver 350 (FIG. 3).

FIG. 9 shows a system diagram in accordance with various embodiments of the present invention. System 900 includes processor 920, memory 930, and integrated circuits 940 and 950 coupled by conductors 102 and 104. Integrated circuits 940 and 950 can by any of the integrated circuit embodiments previously described, or equivalents thereof. For example, either or both integrated circuits 940 and 950 can be a processor such as a microprocessor, a digital signal processor, a microcontroller, or the like. Integrated circuits 940 or 950 can also be an integrated circuit other than a processor such as an application-specific integrated circuit (ASIC), a communications device, a modem, a testing device, a network router, a memory controller, or a memory such as a dynamic random access memory (DRAM).

Processor 920 is coupled to integrated circuits 940 and 950 by bus 960. In some embodiments, processor 920 receives information on bus 960 that represents received signal amplitudes, and processor 920 may perform calculations based on that information. For example, processor 920 may perform actions associated with equalization setting calculator 168 (FIG. 1). Also for example, processor 920 may perform all or a subset of the actions listed in methods 500 (FIG. 5) and 700 (FIG. 7). Also in some embodiments, processor 920 provides control information to integrated circuits 940 and 950. For example, in some embodiments of the present invention, processor 920 provides equalization control information associated with equalization control block 122 (FIG. 1), or equalization setting calculator and control block 626 (FIG. 6). Processor 920 can be any type of processor including, but not limited to, a microprocessor, a microcontroller, a digital signal processor, or the like. Also for example, processor 920 may be a hardware controller or a collection of hardware controllers that perform specific tasks.

Memory 930 represents an article that includes a machine-accessible medium. For example, memory 930 may represent any one or more of the following: a hard disk, a floppy disk, random access memory (RAM), read only memory (ROM), flash memory, CDROM, or any other type of article that includes a medium readable by a machine. Memory 930 may store instructions for performing the execution of the various method embodiments of the present invention. Memory 930 may also include data describing the current state of system 900.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method comprising:
measuring alternating current (AC) and direct current (DC) signal amplitudes on a first transmission line;
determining an equalization setting in response to a ratio of the AC and DC signal amplitudes; and
applying the equalization setting to a driver that drives a second transmission line.

2. The method of claim 1 wherein measuring AC and DC signal amplitudes comprises varying an offset of a variable offset comparator.

3. The method of claim 1 wherein measuring AC and DC signal amplitudes comprises sampling an output of a receiver coupled to the first transmission line.

4. The method of claim 1 wherein determining the equalization setting comprises comparing the ratio to other ratios derived from possible equalization settings.

5. The method of claim 1 wherein applying the equalization setting comprises setting a plurality of driver elements within the driver to drive equalization data.

6. The method of claim 1 further comprising applying the equalization setting to one or more additional drivers that are configured to drive transmission lines with characteristics similar to characteristics of the second transmission line.

7. A method comprising:
measuring alternating current (AC) and direct current (DC) signal amplitudes on a transmission line;
determining an equalization setting in response to a ratio of the AC and DC signal amplitudes; and
transmitting the equalization setting to a driver.

8. The method of claim 7 wherein transmitting comprises sending the equalization setting from a first integrated circuit to a second integrated circuit.

9. The method of claim 8 wherein measuring comprises varying an offset of a variable offset comparator in the first integrated circuit.

10. The method of claim 8 wherein determining the equalization setting comprises comparing the ratio to ratios derived from possible equalization settings.

11. An apparatus comprising a machine accessible medium having instructions stored thereon, wherein the instructions, when accessed, result in a machine performing:
determining a first amplitude of a direct current (DC) signal;

determining a second amplitude of an alternating current (AC) signal; and determining an equalization setting in response to a ratio of the first and second amplitude.

12. The apparatus of claim 11 wherein determining the first amplitude comprises:

transmitting the DC signal from a driver;

receiving the DC signal at a receiver; and measuring the first amplitude as an amplitude of the DC signal at the receiver.

13. The apparatus of claim 12 wherein transmitting comprises transmitting a constant sequence of digital values from the driver.

14. The apparatus of claim 13 wherein transmitting the constant sequence of digital values comprises transmitting a series of digital ones.

15. The apparatus of claim 13 wherein measuring the first amplitude comprises varying an offset of a variable offset comparator.

16. The apparatus of claim 12 wherein determining the second amplitude comprises:

transmitting an AC signal from the driver;

receiving the AC signal at the receiver; and measuring the second amplitude as an amplitude of the AC signal at the receiver.

17. The apparatus of claim 16 wherein transmitting the AC signal comprises transmitting an alternating sequence of digital values from the driver.

18. The apparatus of claim 16 wherein measuring the second amplitude comprises varying an offset of a variable offset comparator.

19. The apparatus of claim 11 wherein determining the equalization setting comprises comparing the ratio to other ratios that correspond to other equalization settings.

20. The apparatus of claim 11 wherein the method further comprises applying the equalization setting to the driver to provide equalization.

21. The apparatus of claim 20 wherein applying the equalization setting comprises:

enabling a plurality of driver elements to drive actual data; and enabling a second plurality of driver elements to drive equalization data.

22. An apparatus comprising:

a receiver to receive a signal from a transmission line;

an amplitude measuring device to measure a direct current (DC) signal amplitude of the signal, and to measure an alternating current (AC) signal amplitude of the signal; and an equalization setting calculator to determine an equalization setting using the DC signal amplitude and the AC signal amplitude.

23. The apparatus of claim 22 further including a driver to receive the equalization setting.

24. The apparatus of claim 23 wherein the receiver is in a first integrated circuit and the driver is in a second integrated circuit, the apparatus further comprising a back-channel to communicate the equalization setting from the first integrated circuit to the second integrated circuit.

25. The apparatus of claim 23 wherein the receiver and driver are in a common integrated circuit.

26. The apparatus of claim 25 wherein the receiver and driver are part of a simultaneous bi-directional port circuit.

27. The apparatus of claim 23 wherein the driver includes:

a first plurality of parallel current mode driver segments configured to be responsive to outbound data; and a second plurality of parallel current mode driver segments configured to be responsive to either the outbound data or equalization data.

28. An electronic system comprising:

a memory device to drive a transmission line;

a receiver to receive a signal from the transmission line;

an amplitude measuring device to measure a direct current (DC) signal amplitude of the signal, and to measure an alternating current (AC) signal amplitude of the signal; and an equalization setting calculator to determine an equalization setting using the DC signal amplitude and the AC signal amplitude.

29. The electronic system of claim 28 further comprising a driver to be influenced by the equalization setting, the driver including:

a first plurality of parallel current mode driver segments configured to be responsive to outbound data; and a second plurality of parallel current mode driver segments configured to be responsive to either the outbound data or equalization data.

30. The electronic system of claim 29 wherein the receiver and driver are in a common integrated circuit.

* * * * *